(12) United States Patent
Lee et al.

(10) Patent No.: US 6,667,228 B2
(45) Date of Patent: Dec. 23, 2003

(54) METHOD FOR FABRICATING CELL PLUGS OF SEMICONDUCTOR DEVICE

(75) Inventors: Yoon Jik Lee, Chungcheongbuk-do (KR); Jeong Tae Kim, Seoul (KR)

(73) Assignee: Hynix Semiconductor Inc., Kyoungki-do ( * ) Notice: Subject to any disclaimer, the term of this patent is extended or adjusted under 35 U.S.C. 154(b) by 0 days.

(21) Appl. No.: 10/166,685

(22) Filed: Jun. 12, 2002

(65) Prior Publication Data

US 2002/0186601 A1 Dec. 12, 2002

(30) Foreign Application Priority Data

Jun. 12, 2001 (KR) .......................... 2001-32904

(51) Int. Cl.[7] .......................................... H01L 21/3205
(52) U.S. Cl. ...................... 438/592; 438/656; 438/675
(58) Field of Search ................................ 438/592, 655, 438/656, 672, 675

(56) References Cited

U.S. PATENT DOCUMENTS 6,093,615 A * 7/2000 Schuele et al. ............. 438/653
6,171,970 B1 * 1/2001 Xing et al. .................. 438/706
6,455,424 B1 * 9/2002 McTeer et al. ............. 438/675
6,511,879 B1 * 1/2003 Drynan ....................... 438/672

FOREIGN PATENT DOCUMENTS

EP       0 977 257 A2    2/2000

* cited by examiner

Primary Examiner—Chandra Chaudhari
(74) Attorney, Agent, or Firm—Birch, Stewart, Kolasch & Birch, LLP

(57) ABSTRACT

A method for fabricating cell plugs of a semiconductor device is disclosed, which increases the operation speed of the semiconductor device by reducing the cell plug resistance of the device. The method includes the steps of forming a first insulating interlayer on a semiconductor substrate, forming a first cell plug on the semiconductor substrate through the first insulating interlayer, forming a second insulating interlayer on the semiconductor substrate, forming a silicide contact on a predetermined surface of the first cell plug through the first insulating interlayer, and forming a second cell plug on the silicide contact through the second insulating interlayer.

28 Claims, 5 Drawing Sheets

METHOD FOR FABRICATING CELL PLUGS OF SEMICONDUCTOR DEVICE

RELATED APPLICATION

The present application claims the benefit of Korean Patent Application No. P2001-32904 filed Jun. 12, 2001, which is herein fully incorporated by reference.

BACKGROUND OF THE INVENTION

1. Field of the Invention

The present invention relates to a method for fabricating a semiconductor device, and more particularly, to a method for fabricating cell plugs of a semiconductor device, which reduces cell plug resistance and thereby increases the reading/writing operation speed of the semiconductor device.

2. Discussion of the Related Art

A method for fabricating cell plugs of a semiconductor device according to a related art will be described with reference to the accompanying drawings. Particularly, FIGS. 1A to 1G are sectional views illustrating process steps for fabricating cell plugs of a Metal-Insulator-Metal (MIM) Structure according to a related art.

As shown in FIG. 1A, a plurality of gates 12 are formed on a predetermined region of a semiconductor substrate 11. An insulating film is deposited on the entire surface of the semiconductor substrate 11 including the gates 12. The insulating film is then selectively removed to form insulating film sidewalls 13 on both sides of the gates 12.

Then, although not shown, impurity ions are injected into a predetermined region of the semiconductor substrate 11 so as to form source/drain impurity regions in the semiconductor substrate 11 at both sides of the gates 12 adjacent the insulating film sidewalls 13.

Afterwards, a first insulating interlayer 14 of a predetermined thickness is deposited on the entire surface of the semiconductor substrate 11. The first insulating interlayer 14 is then polished by an etch-back or chemical mechanical polishing (CMP) process to expose upper portions of the gates 12.

Then, the first insulating interlayer 14 is selectively removed so that a portion above the semiconductor substrate 11 corresponding the source/drain impurity region between the gates 12 is exposed to define a first contact hole 17a through the first insulating interlayer 14. A polysilicon or monosilicon film is buried in the first contact hole 17a to form a first cell plug 15.

Subsequently, a second insulating interlayer 16 is deposited on the entire surface of the semiconductor substrate 11 and selectively removed by photolithography or etching processes. This exposes an upper surface of the first cell plug 15 and its adjacent regions to define a second contact hole 17b through the second insulating interlayer 16.

Then, as shown in FIG. 1B, a second cell plug material 18 is deposited on the entire surface of the semiconductor substrate 11 including the second contact hole 17b. In this case, a monosilicon or polysilicon film is used as the second cell plug material 18.

Then, as shown in FIG. 1C, the second cell plug material 18 on an upper portion of the second insulating interlayer 16 is selectively removed to remain only in the second contact hole 17b. This forms a second cell plug 18a. In this case, the second cell plug material 18 is removed by an etch-back or CMP process.

Then, as known, a silicide contact as well as a barrier metal are formed between a storage node and the second cell plug 18a to produce a MIM structure. In this process, to define regions for forming the silicide contact and the barrier metal, as shown in FIG. 1D, the upper portion of the second cell plug 18a is removed by a thickness of several tens of nm by an etch-back process. Then, as shown in FIG. 1E, a silicide contact 19 made of a titanium silicide film is formed on the exposed upper surface of the second cell plug 18a. This can be accomplished by depositing a titanium film using a physical vapor deposition (PVD) process, annealing the titanium film to cause silicon in the second cell plug 18a to react with the titanium in the titanium film, and removing portions of the titanium film that do not react with silicon. In the alternative, the silicide contact 19 can be formed by using an in-situ titanium silicide deposition process through a chemical vapor deposition (CVD) process.

Then, as shown in FIG. 1F, a titanium nitride film 20 is deposited on the entire surface of the semiconductor substrate 11 including the silicide contact 19. Subsequently, as shown in FIG. 1G, the titanium nitride film 20 on the upper portion of the second insulating interlayer 16 is selectively removed by an etch-back or CMP process so as to form a barrier film 20a on the silicide contact 19. Then, a MIM capacitor (not shown) is formed, which comes into contact with the barrier film 20a. This completes the method of fabricating the cell plugs of a semiconductor device having a MIM structure according to the related art.

These are, however, at least several problems that are associated with such conventional methods. First, silicon of high specific resistance is used as cell plug materials for the first and second cell plugs 15 and 18a. This increases the cell plug resistance of the semiconductor device (e.g., memory device) in accordance with the design rules of the semiconductor device. An increase in the cell plug resistance is a problem because it decreases the reading/writing operation speed of the semiconductor device.

Second, in order to form the silicide contact 19 and the barrier film 20a between a lower electrode of the MIM capacitor and the second cell plug 18a, the conventional method requies complicated processes such as an etch-back process for forming the second cell plug 18a, processing steps including a polishing process for forming the barrier film 20a, etc. As a result, the conventional method of fabricating cell plugs involves complex and multiple steps and requires lengthy processing time.

SUMMARY OF THE INVENTION

Accordingly, the present invention is directed to a semiconductor device with cell plugs and a method for fabricating the same that substantially obviates one or more problems due to limitations and disadvantages of the related art.

An object of the present invention is to provide a method for fabricating cell plugs of a semiconductor device, which can increase an operation speed of a semiconductor memory device and simplify the fabrication process.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating cell plugs of a semiconductor device according to one embodiment of the present invention, includes the steps of forming a first insulating interlayer on a semiconductor substrate whereby a predetermined lower pattern is formed, forming a first cell plug connected to the semiconductor substrate by passing through the first insulating interlayer, forming a second insulating interlayer on the entire surface of the semiconductor substrate, forming a contact hole on the second insulating interlayer so that an upper surface of the first cell plug is exposed, forming a silicide contact on the exposed surface of the first cell plug, forming a second cell plug material on the entire surface including the contact hole, and removing the second cell plug material on the second insulating interlayer through a polishing process so as to form a second cell plug in the contact hole.

In accordance with one embodiment, the present invention is directed to a method for fabricating a semiconductor device having cell plugs, the method comprising the steps of forming a first insulating interlayer on a semiconductor substrate, forming a first cell plug on the semiconductor substrate through the first insulating interlayer, forming a second insulating interlayer on the semiconductor substrate, forming a silicide contact on a predetermined surface of the first cell plug through the first insulating interlayer, and forming a second cell plug on the silicide contact through the second insulating interlayer.

In accordance with one embodiment, the present invention is directed to a semiconductor device comprising first insulating interlayer on a semiconductor substrate, first cell plug on the semiconductor substrate through the first insulating interlayer, a second insulating interlayer on the first insulating interlayer, a silicide contact on a predetermined surface of the first cell plug through the first insulating interlayer, and a second cell plug on the silicide contact through the second insulating interlayer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

FIGS. 2A to 2D are sectional views illustrating processing steps for fabricating cell plugs of a semiconductor device according to a preferred embodiment of the present invention.

Figure 1A:
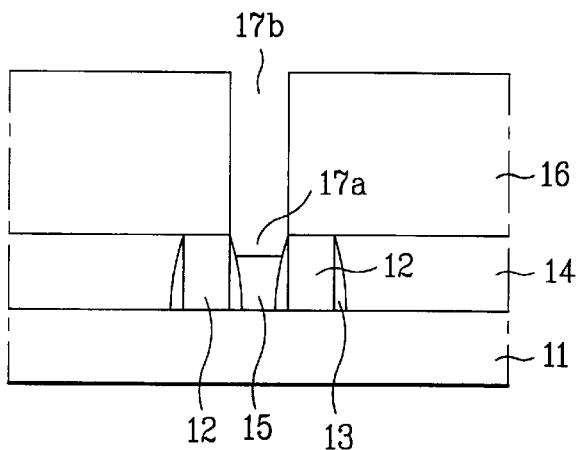
FIGS. 1A to 1G are sectional views illustrating processing steps for fabricating cell plugs of a semiconductor device according to a related art.
Figure 1B:
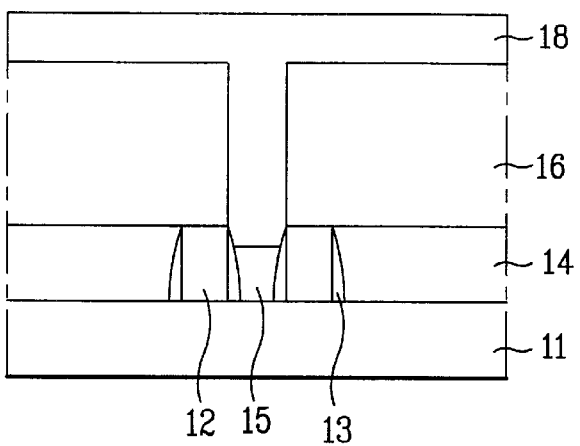
Figure 1C:
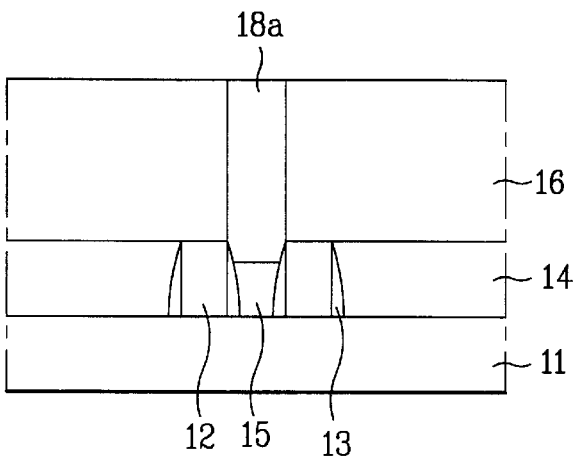
Figure 1D:
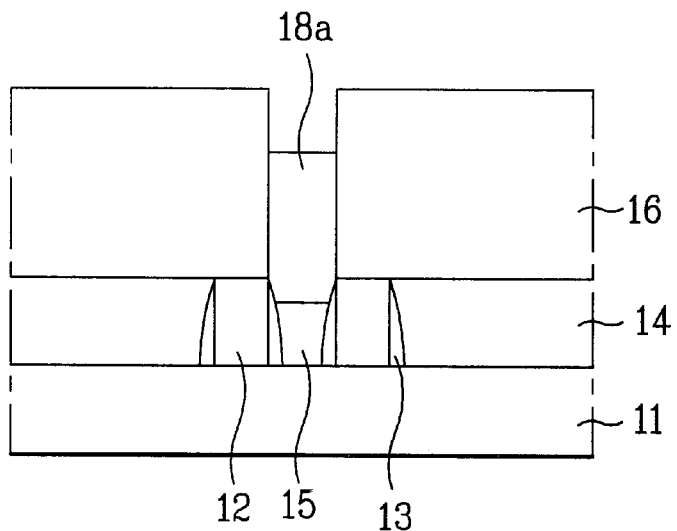
Figure 1E:
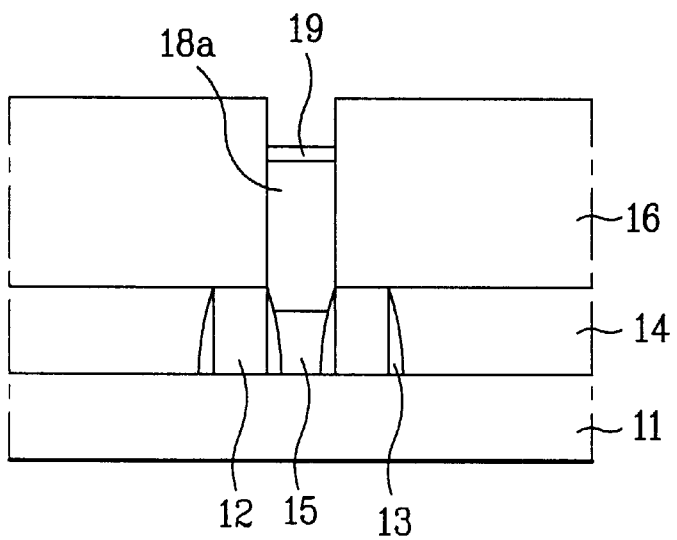
Figure 1F:
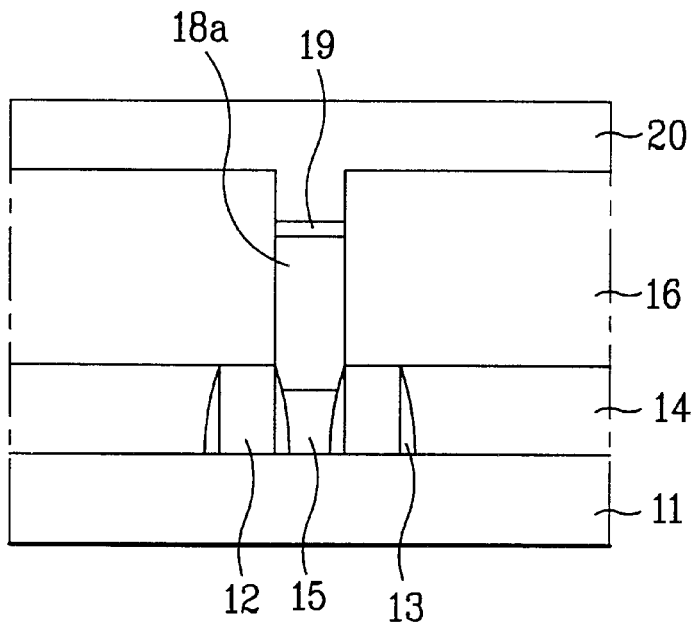
Figure 1G:
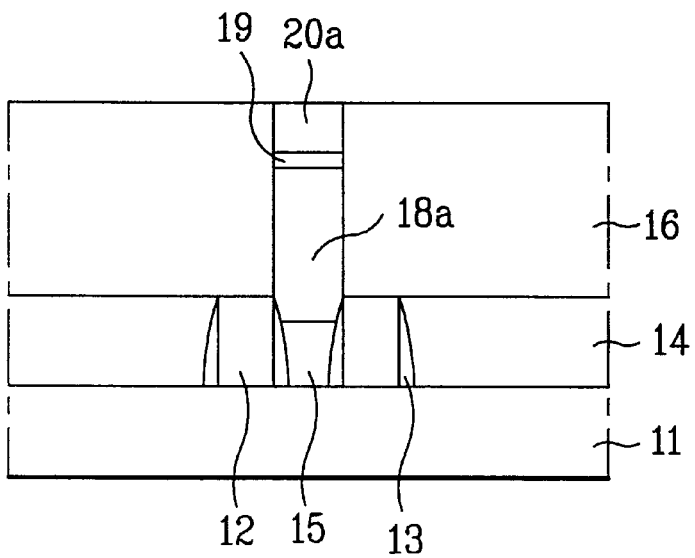
Figure 2A:
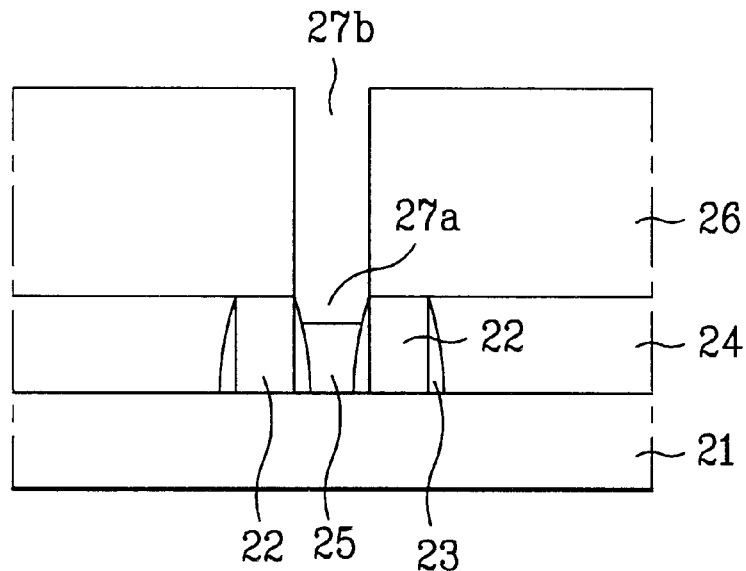
FIGS. 2A to 2D are sectional views illustrating processing steps for fabricating cell plugs of a semiconductor device according to a preferred embodiment of the present invention.

As shown in FIG. 2A, in the fabrication method according to one embodiment of the present invention, a plurality of gates 22 are formed on a semiconductor substrate 21. An insulating film is then deposited on the entire surface of the semiconductor substrate 21 including the gates 22. The insulating film is then selectively removed by an etch-back process or other existing process, so that insulating film sidewalls 23 are formed on both sides of each of the gates 22. Although not shown, impurity ions are injected into the semiconductor substrate 21 so as to form source/drain impurity regions in the substrate 21 at the sides of the gates 22 and sidewalls 23 according to known techniques.

Then, a first insulating interlayer 24 is formed on the entire surface of the semiconductor substrate 21 and a flattening or etching process is performed on the first insulating interlayer 24 so that the upper portions of the gates 22 are exposed.

Subsequently, the first insulating interlayer 24 is selectively removed, so that a predetermined portion of the semiconductor substrate 21 corresponding to the source/drain impurity region is exposed to define a first contact hole 27a between the gates 22. Then, a silicon film such as a monosilicon or polysilicon film is deposited on the entire surface of the semiconductor substrate 21 including the first contact hole 27a. The silicon film is then selectively removed by an etch-back, CMP or other known process so that the silicon film remains only within the first contact hole 27a. This produces a first cell plug 25 positioned in the first contact hole 27a through the first insulating interlayer 24.

Then, a second insulating interlayer 26 is formed on the entire surface of the semiconductor substrate 21. Then the second insulating interlayer 26 is selectively removed by photolithography or etching process to expose the first cell plug 25 and its adjacent regions so as to define a second contact hole 27b on the first cell plug 25 through the second insulating interlayer 26 and a portion of the first insulating interlayer 24.

In another embodiment, instead of forming the first contact hole 27a after the first insulating interlayer 24 is deposited, a second insulating interlayer 26 is deposited on the first insulating interlayer 24 (without the first contact hole). Then the first insulating interlayer 24 and the second insulating interlayer 26 are removed selectively to expose a portion of the semiconductor substrate 21 corresponding to the impurity region and thereby form an extended contact hole corresponding to the first and second contact holes combined together. A silicon film such as a monosilicon or polysilicon film is then deposited on the entire surface of the semiconductor substrate 21 and buried in the extended contact hole. Then the silicon film formed on the second insulating interlayer 24 and a portion of the silicon film buried in the extended contact hole are removed by an etch-back process or the like to form the first cell plug 25 and a contact hole (27b) on the first cell plug 25 through the second insulating interlayer 24.

Figure 2B:
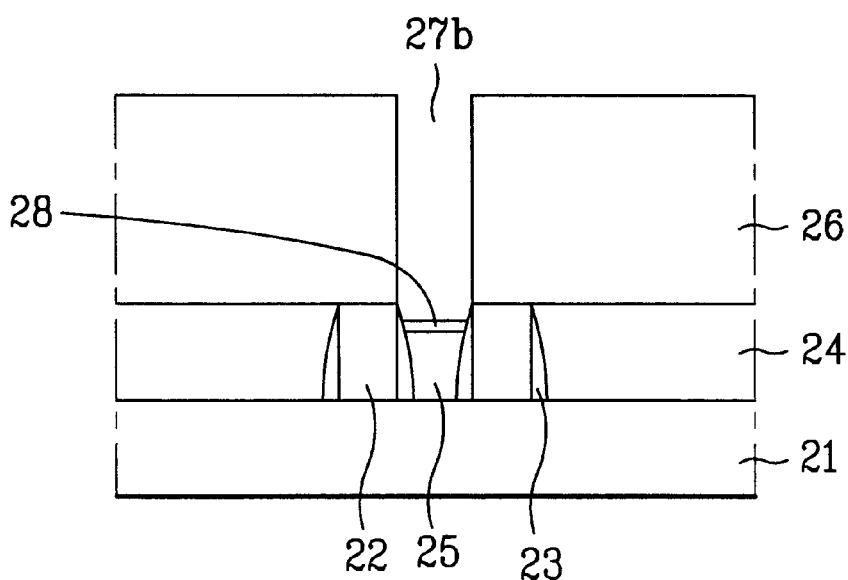

Referring to FIG. 2B, once the first cell plug 25 is formed, a silicide contact 28 is formed on the exposed upper portion of the first cell plug 25 through the first insulating interlayer 24. The silicide contact 28 is made of a titanium silicide film or other suitable known materials, and can be formed by using one of two methods. The first method involves depositing a titanium (Ti) film on the entire surface of the semiconductor substrate 21, and annealing the titanium film to cause silicon in the first cell plug 25 to react with titanium in the titanium (Ti) film to form the silicide contact 28. In this case, portions of the titanium film that do not react with the silicon are removed. The Ti film can be deposited by using a physical vapor deposition (PVD) process or other processes. The second method involves a process of in-situ titanium silicide deposition through CVD process. Although both of these methods can be used, however, the second method is more advantageous than the first method since its step coverage is excellent and does not require an annealing process, which is needed in the first method. Overall, the second method is simpler than the first method. Although two methods have been discussed for forming the silicide contact 28, the present invention is not limited to these two methods, but can include other methods or techniques know in the art.

Figure 2C:
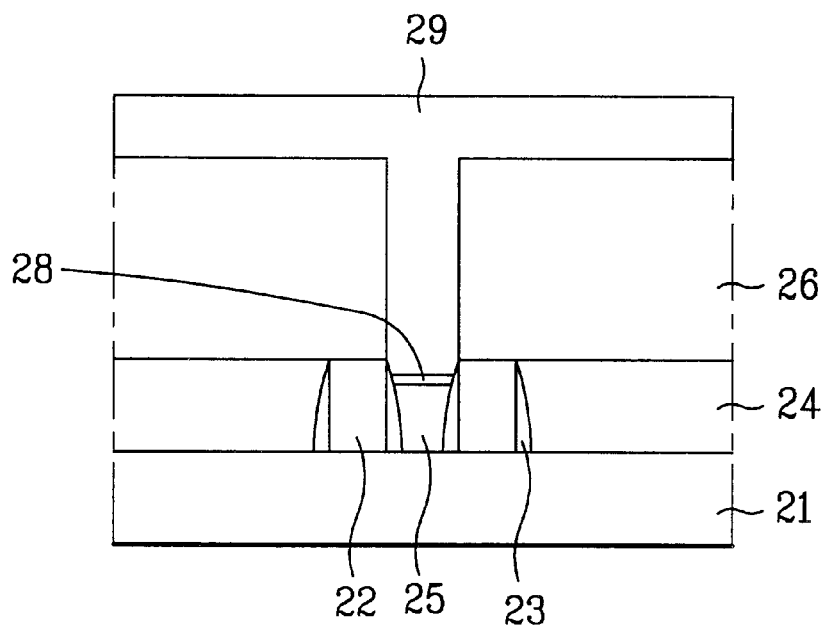

As shown in FIG. 2C, once the silicide contact 28 is formed on the first cell plug 25, a metal film such as a titanium nitride (TiN) film 29 functioning as both a barrier metal film and a second cell plug is deposited on the entire surface of the semiconductor substrate 21 including the second contact hole 27b, e.g., by a CVD process.

Figure 2D:
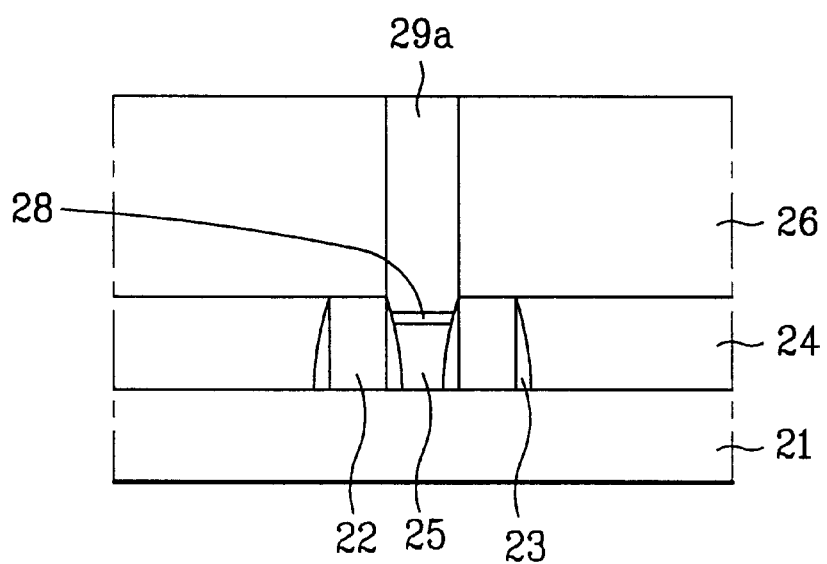

Then, as shown in FIG. 2D, the titanium nitride film 29 on the upper portion of the second insulating interlayer 26 and above the second contact hole 27b is selectively removed by an etch-back, CMP, or other known process so that the titanium nitride film 29 remains only in the second contact hole 27b. This produces a second cell plug 29a buried the second contact hole 27b. In the present invention, the second cell plug 29a is made of a metal with low resistance, instead of a silicon film of high resistance as in conventional cell plug devices.

Then, a capacitor (not shown) of a MIM structure is formed on the second cell plug 29a using known techniques to contact the second cell plug 29a. This completes the method of fabricating the cell plugs of the semiconductor device according to the present invention.

The method for fabricating the cell plugs of a semiconductor device (e.g., a semiconductor memory device) according to the embodiments of the present invention has many advantages including the following.

First, since a metallic material with low specific resistance is used as a cell plug material for the second cell plug 29a, the overall cell plug resistance can be reduced remarkably and thus the operation speed of the semiconductor device can be increased significantly.

Second, complicated processes such as the process of forming a separate titanium silicide contact necessary for establishing a contact between the lower electrode of the MIM capacitor and the second cell plug, and a separate process of burying and flattening a metal barrier, are not required in the present invention since the second cell plug functions as a barrier metal film and is made of a metallic material. This simplifies greatly the overall fabricating process for producing cell plugs of a semiconductor device.

Third, since the simplified fabrication process of the invention decreases a loss of a bitline hard mask occurring during CMP, especially in a device with a Capacitor Over Bitline (COB) structure, the present invention increases process margin and yields of the device significantly.

The foregoing embodiments are merely exemplary and are not to be construed as limiting the present invention. The present teachings can be readily applied to other types of apparatuses, methods, and systems. The description of the present invention is intended to be illustrative, and not to limit the scope of the claims. Many alternatives, modifications, and variations will be apparent to those skilled in the art.

What is claimed is:

1. A method for fabricating a semiconductor device having cell plugs, the method comprising the steps of:
    forming a first insulating interlayer on a semiconductor substrate;
    forming a first cell plug on the semiconductor substrate through the first insulating interlayer;
    forming a second insulating interlayer on the semiconductor substrate;
    forming a silicide contact on a predetermined surface of the first cell plug through the first insulating interlayer; and
    forming a second cell plug on the silicide contact through the second insulating interlayer;
    wherein the second cell plug is formed of a metallic material with low resistance.

2. The method of claim 1, wherein the steps of forming the first and second insulating interlayers are performed prior to the step of forming the first cell plug.

3. The method of claim 2, wherein the steps of forming the first and second insulating layers include the steps of:
    depositing sequentially first and second insulating materials on the semiconductor substrate; and
    selectively removing portions of the first and second insulating interlayers to define an extended contact hole through the first and second insulating interlayers.

4. The method of claim 3, wherein the step of forming the first cell plug includes the step of:
    filling a lower portion of the extended contact hole with a first cell plug material to form the first cell plug.

5. The method of claim 1, wherein the step of forming the first insulating interlayer includes the steps of:
    depositing a first insulating layer on the semiconductor substrate; and
    selectively removing portions of the first insulating layer to define a first contact hole.

6. The method of claim 5, wherein the the step of selectively removing portions of the first insulating layer is performed by using an etch-back process or a chemical mechanical polishing (CMP) process.

7. The method of claim 5, wherein the step of forming the first cell plug includes the steps of:
    depositing a first cell plug material in the first contact hole; and
    removing selectively the first cell plug material to form the first cell plug in the first contact hole.

8. The method of claim 7, wherein the step of removing selectively the first cell plug material is performed by using an etch-back process or a chemical mechanical polishing (CMP) process.

9. The method of claim 7, wherein the step of forming the second insulating interlayer includes the steps of:
    depositing a second insulating layer on the first insulating interlayer and on the first cell plug; and
    removing selectively portions of the second insulating layer to define a second contact hole above the first cell plug.

10. The method of claim 9, wherein the second cell plug is formed in the second contact hole and portions of the first contact hole.

11. The method of claim 1, wherein the metallic material is a titanium nitrite film.

12. The method of claim 1, wherein the first cell plug is formed of a silicon material.

13. The method of claim 12, wherein the silicon material is either a monosilicon film or a polysilicon film.

14. The method of claim 1, wherein the silicide contact is formed by an in-situ titanium silicide deposition process through a chemical vapor deposition (CVD) process.

15. The method of claim 1, wherein the step of forming the silicide contact includes the steps of:
   depositing a metal film on the semiconductor substrate and on the first cell plug; and
   annealing the metal film to cause reaction between a material of the first cell plug with the metal film to form the silicide contact.

16. The method of claim 15, wherein the metal film is formed of titanium (Ti).

17. The method of claim 15, wherein the step of depositing the metal film is performed by using a physical vapor deposition (PVD) process.

18. The method of claim 1, wherein the silicide contact is formed directly on the first cell plug through the first insulating interlayer.

19. The method of claim 1, further comprising the steps of:
   forming gates on the semiconductor substrate through the first insulating interlayer; and
   forming an impurity region in the semiconductor substrate between the gates, wherein the first cell plug is formed on the impurity region of the semiconductor substrate.

20. The method of claim 1, wherein a top surface of the second cell plug is flush with a top surface of the second insulating interlayer such that the top surfaces are contained in one same plane.

21. The method of claim 1, wherein a thickness of the second cell plug exceeds a thickness of the second insulating interlayer.

22. The method of claim 1, further comprising:
   forming gates on the semiconductor substrate through the first insulating interlayer,
   wherein the silicide contact is positioned lower than a top surface of the gates.

23. The method of claim 1, wherein the second cell plug is not formed of a silicon material.

24. A method for fabricating a semiconductor device, the method comprising:
   forming a first insulating layer on a semiconductor substrate, the first insulating layer having a first contact hole defined therethrough;
   forming a second insulating layer on the first insulating layer, the second insulating layer having a second contact hole defined through the second insulating inner layer and extending from the first contact hole;
   forming a first cell plug on the semiconductor substrate and in the first contact hole;
   forming a silicide contact on the first cell plug and in the first contact hole; and
   forming a second cell plug on the silicide contact and in the entire second contact hole and an upper portion of the first contact hole.

25. The method of claim 24, wherein the second cell plug is not formed of a silicon material.

26. The method of claim 24, further comprising:
   forming gates on the semiconductor substrate through the first insulating layer,
   wherein the silicide contact is positioned lower than a top surface of the gates.

27. The method of claim 24, wherein the second cell plug is formed of a titanium nitride film.

28. The method of claim 24, wherein a top surface of the second cell plug is flush with a top surface of the second insulating layer.

* * * * *